United States Patent
Park et al.

(10) Patent No.: US 7,635,410 B2
(45) Date of Patent: Dec. 22, 2009

(54) APPARATUS FOR DISPENSING PHOTO-RESIST IN SEMICONDUCTOR DEVICE FABRICATION EQUIPMENT

(75) Inventors: Jin-Jun Park, Seoul (KR); Suk-Fill Yun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 560 days.

(21) Appl. No.: 11/452,229

(22) Filed: Jun. 14, 2006

(65) Prior Publication Data

US 2007/0119307 A1    May 31, 2007

(30) Foreign Application Priority Data

Nov. 30, 2005    (KR)    ...................... 10-2005-0115742

(51) Int. Cl.
    *B01D 19/00*    (2006.01)
(52) U.S. Cl. .............................. 96/156; 96/157; 96/193; 96/196; 96/219; 95/248; 95/259; 118/610
(58) Field of Classification Search .................. 96/157, 96/193, 196, 219, 156; 95/266, 261, 247, 95/248, 259; 118/610
    See application file for complete search history.

(56) References Cited

U.S. PATENT DOCUMENTS

| | | | | |
|---|---|---|---|---|
| 2,420,356 A | * | 5/1947 | Compa | ........................ 95/248 |
| 4,935,151 A | * | 6/1990 | Do | .............................. 210/739 |
| 5,262,068 A | * | 11/1993 | Bowers et al. | .............. 210/767 |
| 5,527,161 A | * | 6/1996 | Bailey et al. | .................. 417/53 |
| 5,857,619 A | * | 1/1999 | Huang et al. | .................. 239/11 |
| 5,878,918 A | * | 3/1999 | Liao et al. | .............. 222/189.06 |
| 5,900,045 A | * | 5/1999 | Wang et al. | .................... 95/241 |
| 5,912,054 A | * | 6/1999 | Tateyama | .................. 427/425 |
| 5,989,317 A | * | 11/1999 | Huang et al. | .................. 95/241 |
| 6,071,094 A | * | 6/2000 | Yu et al. | ..................... 417/441 |
| 6,171,367 B1 | * | 1/2001 | Peng et al. | ...................... 95/46 |
| 6,193,783 B1 | * | 2/2001 | Sakamoto et al. | .............. 95/26 |
| 6,332,924 B1 | * | 12/2001 | Shim et al. | .................. 118/684 |
| 6,402,821 B1 | * | 6/2002 | Matsuyama | .................. 96/175 |
| 6,500,242 B2 | * | 12/2002 | Fu et al. | ....................... 96/157 |
| 6,554,579 B2 | * | 4/2003 | Martin et al. | ................. 417/53 |
| 6,726,774 B2 | * | 4/2004 | Tzeng et al. | ................ 118/688 |
| 6,733,250 B2 |  | 5/2004 | Yajima | |

(Continued)

FOREIGN PATENT DOCUMENTS

KR    2002074835 A    * 10/2002

OTHER PUBLICATIONS

English machine translation of KR2002074835A.*

*Primary Examiner*—Duane Smith
*Assistant Examiner*—Douglas J Theisen
(74) *Attorney, Agent, or Firm*—Volentine & Whitt, PLLC

(57) ABSTRACT

A photo-resist dispensing apparatus is disclosed and comprises; a tank adapted to hold a photo-resist solution, a pump unit adapted to pump the photo-resist solution from the tank, a filter unit adapted to receive the photo-resist solution from the pump unit, and at least one of a first gas discharge unit connected to the tank and adapted to remove gas bubbles from the photo-resist solution held in the tank, and a second gas discharge unit connected to the filter unit and adapted to remove gas bubbles from the photo-resist solution in the filter.

18 Claims, 8 Drawing Sheets

U.S. PATENT DOCUMENTS

| | | | |
|---|---|---|---|
| 7,018,472 B2 * | 3/2006 | Yamauchi | 118/300 |
| 7,237,581 B2 * | 7/2007 | Jang | 141/286 |
| 2004/0035449 A1 | 2/2004 | Nam | |
| 2004/0144736 A1 * | 7/2004 | Yajima | 210/805 |
| 2004/0163541 A1 * | 8/2004 | Hayashi | 96/156 |
| 2005/0224132 A1 * | 10/2005 | Jang | 141/1 |

* cited by examiner

APPARATUS FOR DISPENSING PHOTO-RESIST IN SEMICONDUCTOR DEVICE FABRICATION EQUIPMENT

BACKGROUND OF THE INVENTION

1. Field of the Invention

Embodiments of the present invention relate in general to the field of semiconductor device fabrication. More particularly, embodiments of the invention relate to an apparatus for dispensing a photo-resist in a uniformly coat on a semiconductor wafer.

This application claims priority to Korean Patent Application No. 10-2005-0115742 filed on Nov. 30, 2005, the entire contents of which are hereby incorporated by reference.

2. Description of the Related Art

Semiconductor devices are fabricated through the application of a complex sequence of individual processes. Very specialized fabrication equipment has been developed to perform these processes. Precision application of fabrication processes by this specialized equipment is critical to the ultimate quality of the semiconductor devices being fabricated. Many individual fabrication processes are repeatedly applied to a semiconductor wafer during the sequence of processes.

Exemplary fabrication processes include processes adapted to form material layers on the semiconductor wafer, processes adapted to coat the semiconductor wafer with a photo-resist, photolithography processes adapted to transcribe a circuit pattern onto a photo-resist layer, etching processes adapted to selectively remove a portion of a material layer, implantation processes adapted to selectively implant impurities, etc.

Photolithography processes are important components within the sequence fabrication processes used to manufacture semiconductor devices. Such processes are critical to the determination of certain critical dimensions and geometries that implement the circuitry of the semiconductor devices. These critical dimensions are constantly reduced in attempts to maximize the productivity of semiconductor devices per unit wafer. This downward pressure on critical dimensions places constant performance demands upon the precision of conventional photolithography processes.

The equipment used to perform photolithography processes includes photo spinner equipment and/or exposure equipment. Photo spinner equipment comes in a variety of forms from different suppliers, but it generally includes a spin coater unit adapted to coat a photo-resist solution onto a wafer, a plurality of baking units adapted to bake and hardening the spin coated photo-resist, an exposure unit adapted to selectively expose the photo-resist formed on an edge portion of the wafer and thereafter selectively expose the photo-resist using a mask film such as a reticle, a developer unit adapted to develop the photo-resist, and a wafer transfer and interface unit adapted to transfer the wafer between the other units.

The spin coater typically rotates the wafer at a predetermined speed (e.g., 400 rpm) and applies a fixed volume of photo-resist to the center of the rotating wafer in order to uniformly spread the photo-resist over the surface of the wafer. Where an insufficient volume of photo-resist is dispensed onto the center of the wafer the resulting photo-resist layer will be too thin or have gaps formed therein. On the contrary, where an excessive volume of photo-resist is used the overall fabrication costs will rise as a large volume of photo-resist is wasted. Thus, the development of photo-resist dispensing apparatus associated with spin coaters has been the subject of intense research and development.

There are significant obstacles to the precision operation of a photo-resist dispensing apparatus. For example, if the photo-resist being dispensed contains gas bubbles poor quality photo-resist layers will result. An unstable or interrupted supply of photo-resist solution to the dispensing apparatus will also result in poor quality photo-resist layers.

A conventional photo-resist dispensing apparatus adapted to remove gas bubbles in a photo-resist solution is disclosed, for example, in U.S. Pat. No. 6,402,821, the subject matter of which is hereby incorporated by reference. FIG. 1 is a schematic diagram illustrating a conventional photo-resist dispensing apparatus.

As shown in FIG. 1, the conventional photo-resist dispensing apparatus includes a tank 41 having an internal space adapted to hold a photo-resist solution, an opening/closing valve 70 configured to control a supply of the photo-resist solution from tank 41, an intermediate tank 7 configured to remove gas from the photo-resist solution by temporarily storing it, a filter 5 configured to remove any contaminate particles from the photo-resist solution supplied from intermediate tank 7, a discharge valve 42 configured to control a discharge volume of the photo-resist solution, and a dispensing nozzle 3 configured to dispense the photo-resist solution in a controlled manner onto the upper surface of a wafer W as it rotates on a platen 2.

Tank 41 will provide the photo-resist solution through opening/closing valve 70 and a supply line 43 under the force of gas pressure (e.g., nitrogen gas) introduced into tank 41. The introduction of pressurized gas forms gas bubbles in the photo-resist solution within tank 41. Thus, intermediate tank 7 is required to remove the bubbles before being dispensed.

FIG. 2 is a cross-sectional view of intermediate tank 7 shown in FIG. 1. As is shown in FIG. 2, intermediate tank 7 includes; a body 71 having a defined internal space passing photo-resist solution via supply line 43, and an exhaust line 72 coupled to an upper part of body 71 and adapted to discharge gas bubbles precipitating out of the photo-resist solution, and a bubble filter 73 installed in an inlet or an inner portion of exhaust line 72 and adapted to filter discharged gas bubbles. Bubble filter 73 typically includes a membrane configured to prevent the photo-resist solution from passing through exhaust line 72, and selectively pass only gas from body 71.

In the illustrated example, exhaust line 72 is coupled to one side of the upper portion of body 71 while supply line 43 is coupled through the other side of body 71 to be substantially in parallel with exhaust line 72.

Unfortunately, the conventional photo-resist dispensing apparatus suffers from a number of problems. First, it has a disadvantage in that the photo-resist solution delivered within body 71 may pass from the inlet of supply line 43 to the output of supply line 43 without flowing through the bubble filter 73 configured in exhaust line 72. Thus, bubble filter 73 works most effectively on gas bubbles proximate the opening of exhaust line 72. This result yields unreliable results in the removal of bubbles.

In a related vein, the conventional photo-resist dispensing apparatus has the disadvantage of discharging bubbles not only through exhaust line 72, but also through the outlet of supply line 43 coupled to filter 5. Where the photo-resist solution contains a great volume of gas bubbles, many gas bubbles may pass directly through intermediate tank 7 without being removed from bubble filter 73. Any gas bubbles in the photo-resist solution will adversely effect the quality of wafer coating, and thus decreases a productive yield in the semiconductor devices being fabricated.

SUMMARY OF THE INVENTION

Embodiments of the invention provide a photo-resist dispensing apparatus adapted to increase or maximize the productive yield of semiconductor devices by increasing the reliability with which gas bubbles are removed from a photo-resist solution delivered to an intermediate tank.

Embodiments of the invention also provide a photo-resist dispensing apparatus adapted to increase or maximize a productive yield of semiconductor devices by preventing gas bubbles from being delivered to a supply line, even in instances where the photo-resist solution contains a great volume of gas bubbles.

In one embodiment, the invention provides a photo-resist dispensing apparatus comprising; a tank adapted to hold a photo-resist solution, a pump unit adapted to pump the photo-resist solution from the tank, a filter unit adapted to receive the photo-resist solution from the pump unit, and at least one of a first gas discharge unit connected to the tank and adapted to remove gas bubbles from the photo-resist solution held in the tank, and a second gas discharge unit connected to the filter unit and adapted to remove gas bubbles from the photo-resist solution in the filter.

BRIEF DESCRIPTION OF THE DRAWINGS

Several embodiments of the invention will become described with reference to the accompanying drawings, in which.

DESCRIPTION OF EXEMPLARY EMBODIMENTS

Figure 1:
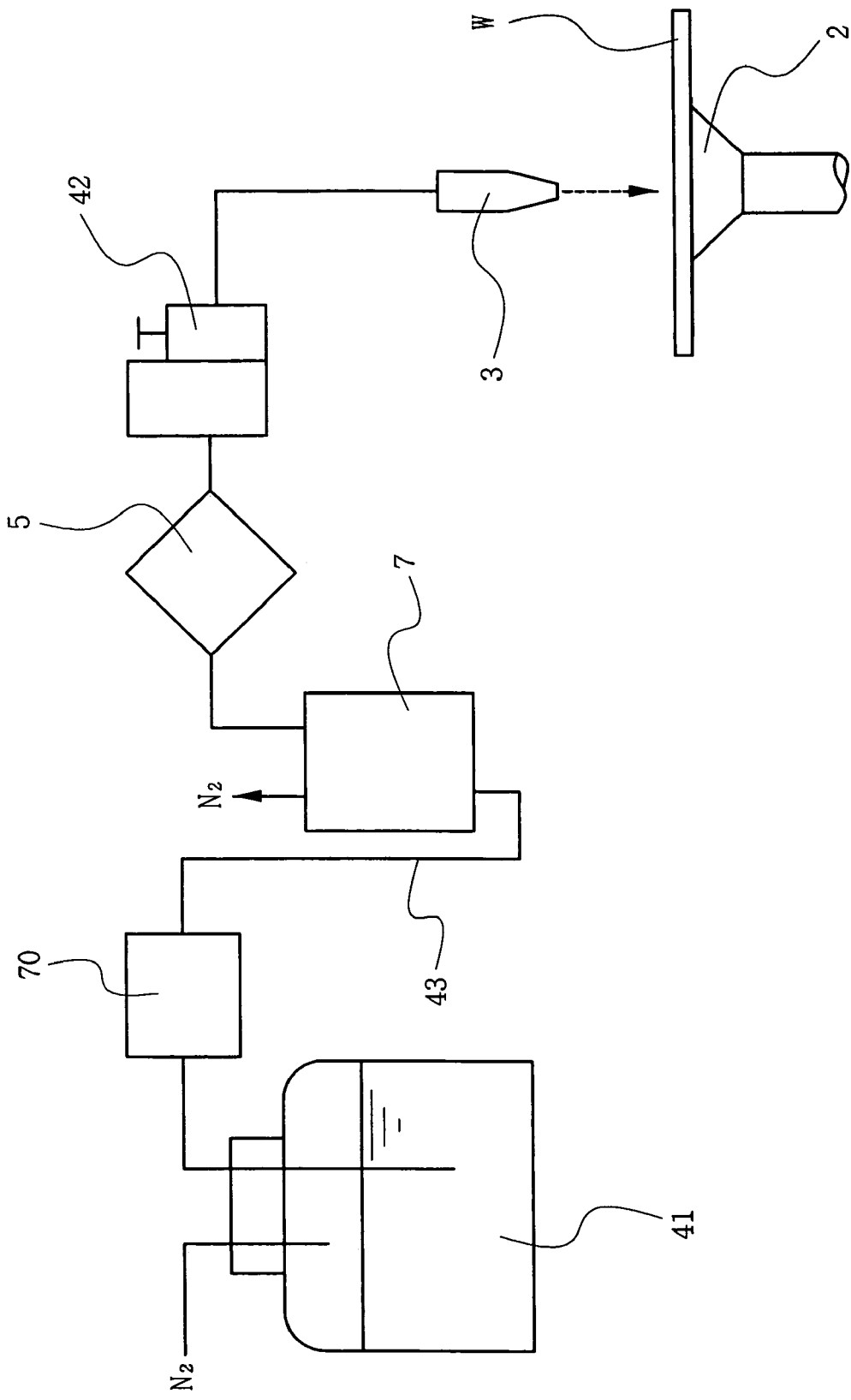
FIG. 1 is a schematic diagram illustrating a conventional photo-resist dispensing apparatus.
Figure 2:
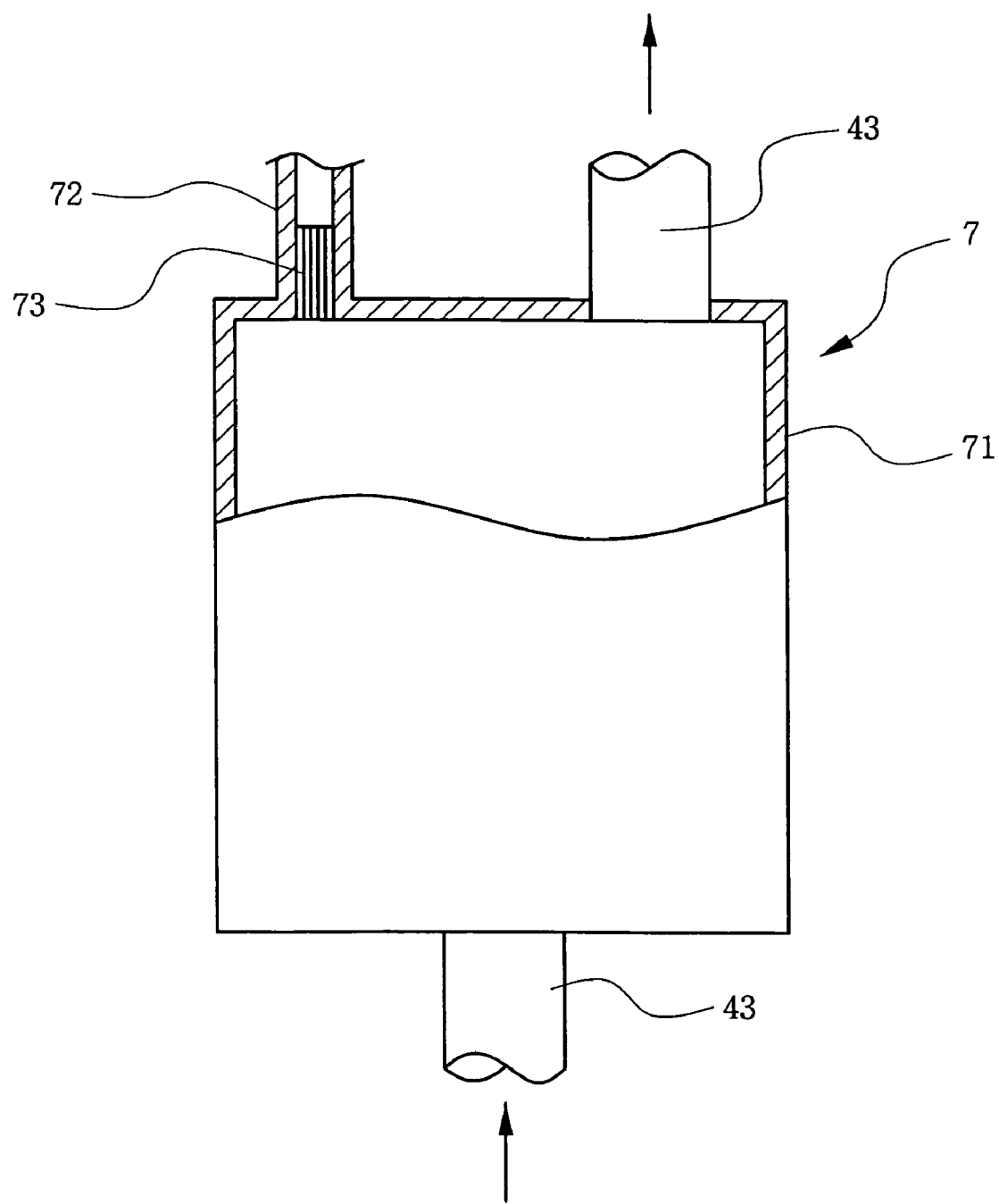
FIG. 2 is a cross-sectional view illustrating an intermediate tank shown in FIG. 2.

Exemplary embodiments of the invention are disclosed herein. However, the specific structural and functional details disclosed are merely representative and are presented as teaching examples. The invention may be variously embodied in many alternate forms and should not be construed as being limited to only the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Figure 3:
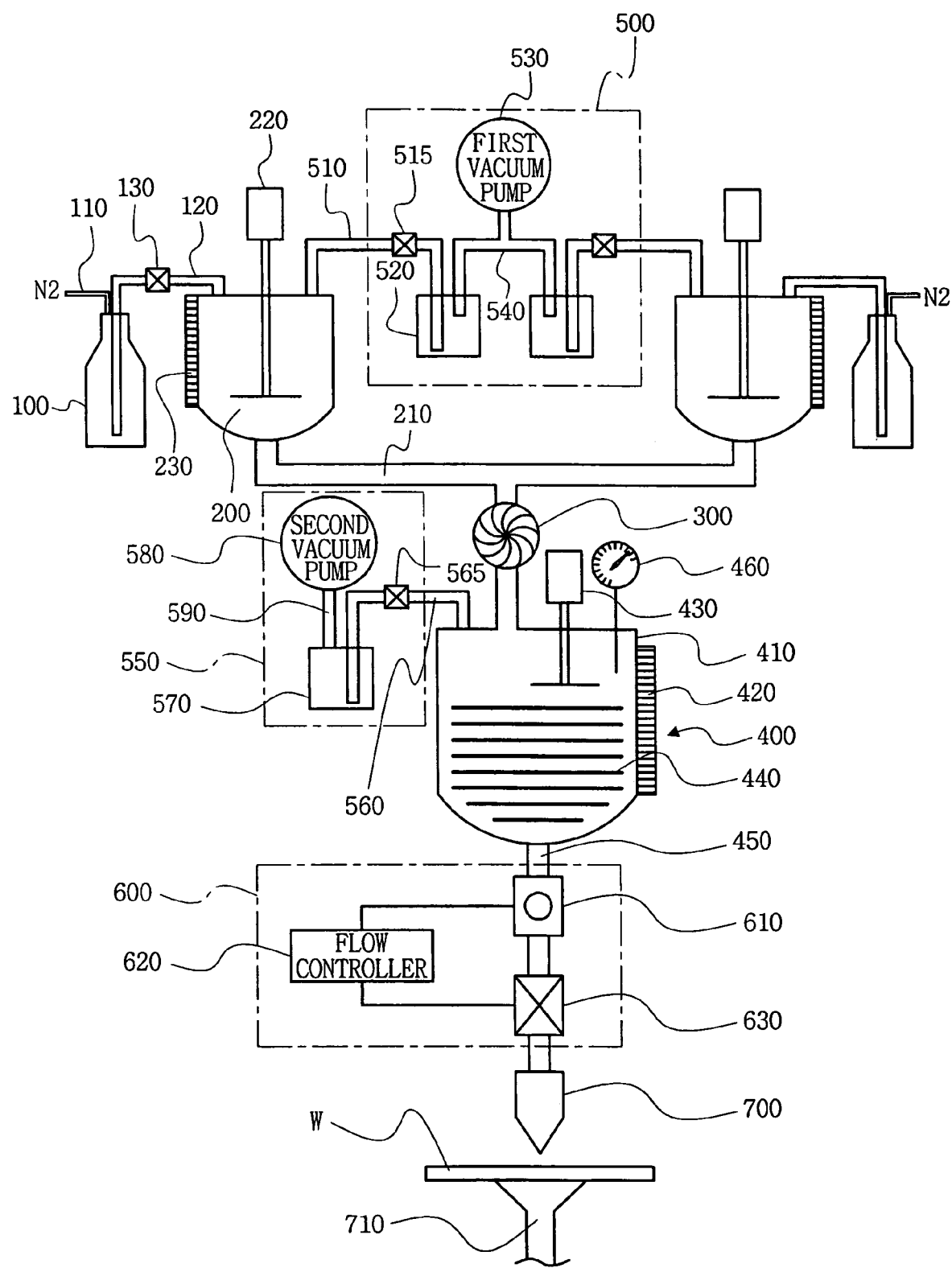
FIG. 3 is a schematic diagram illustrating a photo-resist dispensing apparatus according to an embodiment of the present invention.

FIG. 3 is a schematic diagram illustrating a photo-resist dispensing apparatus according to one embodiment of the invention.

As shown in FIG. 3, the exemplary photo-resist dispensing apparatus comprises a plurality of supply bottles 100 for containing a predetermined volume of photo-resist; a plurality of tanks 200 for temporarily storing the photo-resist received from supply bottle 100; a pump unit 300 for pumping the photo-resist from tank 200 under a predetermined pressure; a filter unit 400 for filtering the photo-resist pumped through pump unit 300 and removing contaminants, and first or second gas discharge units 500 and 550 for removing gas bubbles from the photo-resist solution. Photo-resist solution flows to respective first and second gas discharge units through first vacuum line 510 coupled to an upper end of the tank 200 and a third vacuum line 560 coupled to filter unit 400.

The exemplary photo-resist dispensing apparatus also comprises a discharge control unit 600 for controlling a discharge volume for the photo-resist solution, and a dispensing nozzle 700 for dispensing the photo-resist solution in a controlled manner onto the upper surface of a wafer W rotating on platen 710.

Conventional supply bottles 100 feeding photo-resist solution into the above apparatus are generally easy to transport and pack and come in predetermined colors indicating the particular chemical composition of the photo-resist. For example, supply bottles 100 are commonly formed from optically opaque brown glass and contain about 4 liters (about 1 gallon) of photo-resist. Supply bottles 100 are adapted for connection to a gas inflow line 110 enabling gas, such as nitrogen, to be flowed into an upper portion of supply bottles 100. This connection is made through a stopper placed in supply bottles 100. A first supply line 120 is also connected through the stopper in a position adjacent to gas inflow line 110 and extends to the bottom of the supply bottle 100.

By introducing gas through gas inflow line 110 at the predetermined pressure, the photo-resist solution in supply bottle 100 is provided through first supply line 120 and valve 130 in proportion to the gas pressure. Accordingly, if the level of photo-resist solution in one of the plurality of tanks 200 falls below a predetermined level, photo-resist solution from a supply bottle 100 will re-fill the tank. Alternate tanks 200 may be provided with respective supply bottle 100 and first supply line 120 to allow easy change over of photo-resist supply without interruption of the system. Additionally, each supply bottle 100 may include a level sensor (e.g., a contact-type sensor or an optical sensor) adapted to sense the level of photo-resist solution remaining therein and connected to a supply control unit adapted to query the level sensor and determine when a change over of supply bottle is needed. This supply control unit may be associated with a display unit adapted to display level information, attendant warnings, etc.

Gas bubbles may be generated in the photo-resist solution for many reasons. For example, change over of supply bottles 100 often introduces gas into first supply line 120, or excessive gas may be introduced into the photo-resist solution connection of gas inflow line 110.

As first supply line 120 delivers the photo-resist solution into an upper portion of tank 200, a second supply line 210 is adapted to discharge the photo-resist solution from a lower portion of tank 200 to pump unit 300. Thus, tank 200 provides an air tight chamber sealed off from the external environment.

Tank 200 removes gas bubbles from the photo-resist solution under the negative pumping pressure provided by first gas discharge unit 500. In the illustrated example, gas bubbles are drawn from the photo-resist solution under this pumping pressure at a portion of tank 200 proximate the connection of first supply line 120. For example, first supply line 120 may be coupled to one side of an upper portion of tank 200, and first vacuum line 510 may be coupled to an opposite side of the upper portion of tank 200.

Further, tank 200 may include an agitator 220 configured to motivate the flow of gas bubbles from the photo-resist solution in conjunction with the pumping pressure provided by first gas discharge unit 500. For example, agitator 220 may include a motor (not shown) configured to rotate an axially located stirring rod normally submerged in the photo-resist solution. Since many photo-resist solutions have high viscosity at room temperatures, it is sometimes difficult to remove gas bubbles with negative pressure alone. Further, peculiar viscosity characteristics may result due to solvents mixed into the photo-resist solution under various conditions. In light of these possible variations, the addition of agitator 220 to tank 200 is often highly advantageous, albeit not mandatory within the dictates of the invention.

The pumping pressure provided by first gas discharge unit 500 may be set to a pressure lower than the pressure at which the photo-resist is typically stored in tank 200 and discharged through second supply line 210, but higher than the pressure at which the photo-resist solution is provided by first supply line 120. The pressure with which the photo-resist solution is discharged through second supply line 210 is determined by the pumping pressure provided by pump unit 300. Further, the pressure with which the photo-resist solution is supplied to tank 200 through first supply line 120 may be determined in part by the pumping pressure provided by first gas discharge unit 500.

Under these exemplary conditions, gas bubbles in the photo-resist solution, as supplied at a predetermined pressure by first supply line 120, may be readily removed by increasing the pumping pressure provided by first gas discharge unit 500 and applied to tank 200 which is relatively large in comparison with the diameter of first supply line 120. However, this positive effect must be balanced with the hazard of drawing the photo-resist solution into tank 200 from first supply line 120 under too high a pressure. In this regard, control valve 130 may be configured to help control the flow rate of photo-resist solution through first supply line 120.

A level sensor 230 may be associated with tank 200 to detect the level of photo-resist inside tank 200. Level sensor 230 may be a contact-type sensor which directly senses the level of the photo-resist, or an optical sensor which indirectly senses the level of the photo-resist.

First gas discharge unit 500 includes in addition to first vacuum line 510, a first vacuum trap 520 providing an airtight space adapted to collect gas discharged from first vacuum line 510 and regulate the pumping pressure applied to first vacuum line 510, and a second vacuum line 540 coupling a first vacuum pump 530 to first vacuum trap 520. First vacuum trap 520 is coupled between first vacuum line 510 and second vacuum line 540 in order to preclude the flow of photo-resist into first vacuum pump 530 through second vacuum line 540 even though photo-resist solution may flow together with removed gas bubbles into first vacuum line 510. First vacuum pump 530 may be a rotary pump or a dry pump adapted to removing gas at low vacuum ranging from about $1 \times 10^{-1}$ to $1 \times 10^{-3}$ Torr.

A vacuum pressure sensor may be used to measure the pumping pressure of first vacuum pump 530 and may be provided in an upper portion of tank 200 or in association with first vacuum trap 520. For example, the vacuum pressure sensor may include a Pirani gauge or a Baratron sensor adapted to measure low vacuum pressures. Further, if the pumping operation of first vacuum pump 530 is interrupted, an external gas may back-flow into tank 200 through second vacuum line 540, first vacuum trap 520 and first vacuum line 510. Accordingly, another control valve 515 may be associated with first vacuum trap 520 and/or first vacuum pump 530.

Pump unit 300 may control the supply flow of the photo-resist supplied and discharged to/from tank 200 through second supply line 210. For example, pump unit 300 may include a gear pump suitable for controlling the flow of the photo-resist. Where a gear pump is used, the photo-resist solution is suctioned at one end of the gear while a saw tooth engaged and rotated in a caching of the pump is separated from the suction port on another end. Photo-resist solution is thus transferred to an exhaust port, namely, second supply line 210 coupled to filter unit 400. The gear may be a super gear and a lobe gear. Pressure from pump unit 300 prevents the back flow of photo-resist into tank 200 from second supply line 210 under the pumping pressure of first gas discharge unit 500.

Filter unit 400 includes a housing 410 adapted to hold the photo-resist solution, a level sensor 420 adapted to sense the level of photo-resist in housing 410, an agitator 430 axially inserted into housing 410 and adapted to stir the photo-resist solution, and a filter 440 adapted to filter the photo-resist as it is agitated by agitator 430. Housing 410 may be formed to provide a relatively large volume in comparison with second supply line 210 in order to facilitate the removal of gas bubbles.

Filter 440 is formed so as to remove contaminants such as foreign substances or coagulation materials from the photo-resist. For example, filter 440 may be formed from thin porous plates through which the photo-resist may pass. Such plates may have a pleated design so as to increase an effective filtering area through which the photo-resist will pass. One or more supporters (e.g., a wire mesh) may be provided around the circumference of housing 410 to hold filter 440 and may be further formed so as to prevent the thin-plate filters forming filter 440 from being damaged during use under the pumping pressure of pump unit 300 or second gas discharge unit 550. Further, filter 440 may be formed so as to surround over overlay a centered descending, lower extension of housing 410 connected to a third supply line 450.

Agitator 430 and the second gas discharge unit 550 are respectively connected so as to remove gas bubbles from the photo-resist solution contained in housing 410 according to the principles outlined above.

Second gas discharge unit 550 may comprise a third vacuum line 560 coupled to an upper portion of housing 410 and adapted to discharge gas removed from the photo-resist solution contained in housing 410, a second vacuum trap 570 providing an airspace to collect the discharged gas and regulate the pumping pressure applied, a second vacuum pump 580 adapted to create a negative pumping pressure and draw gas from second vacuum trap 570, and a fourth vacuum line 590 configured to couple second vacuum pump 580 to second vacuum trap 570.

As above, second vacuum trap 570 is coupled to third vacuum line 560 and fourth vacuum line 590 so as to prevent photo-resist from contaminating second vacuum pump 580 by being discharged through fourth vacuum line 590, even though the photo-resist may flowed together with gas into third vacuum line 560.

Second vacuum pump 580 may be a rotary pump or a dry pump in the same manner as first vacuum pump 530. Accordingly, second gas discharge unit 550 may discharge the gas from the photo-resist solution through second vacuum trap 570, third vacuum line 560, and fourth vacuum line 590. With this configuration, when the second vacuum pump 580 is operated photo-resist solution will not back flow into housing 410 from second supply line 210 due to the presence of a control valve associated with third supply line 450. Here again, a vacuum pressure sensor may be configured to measure the pumping pressure of second vacuum pump 580 and may be associated with an upper portion of housing 410 or second vacuum pressure sensor 460. For example, a vacuum pressure sensor 460 may be provide and include a Pirani gauge or a Baratron sensor, similar to the first vacuum sensor. Further, when the pumping operation of second vacuum pump 580 is stopped, an external gas may back flow into housing 410 through fourth vacuum line 590, second vacuum trap 570, and third vacuum pump 580 through second vacuum pump 580. Accordingly, third valve 565 is opened while second vacuum pump 580 is operated, and closed when the second vacuum pump isn't operated. Third valve 565 may be formed in third vacuum line 560.

Accordingly, second gas discharge unit 550 may remove the bubbles contained in the photo-resist which is supplied to housing 410 of filter unit 400 due to the pumping pressure of the second vacuum pump 580.

A discharge control unit 600 may be formed so as to control the supply flow of photo-resist solution to dispensing nozzle 700 through third supply line 450. For example, discharge control unit 600 may include a flow meter 610 for sensing the flow of photo-resist solution from third supply line 450, a flow controller 620 for controlling the flow of photo-resist solution in response to feedback from flow meter 610, and a control valve 630 for controlling the flow of photo-resist solution to dispensing nozzle 700 according to a control signal output from flow controller 620. Flow meter 610 may measure the flow of the photo-resist which flows through third supply line 450 in various forms. For example, flow meter 610 may be formed from an Impeller flow meter, a differential pressure flow meter, or a rotameter.

Figure 4:
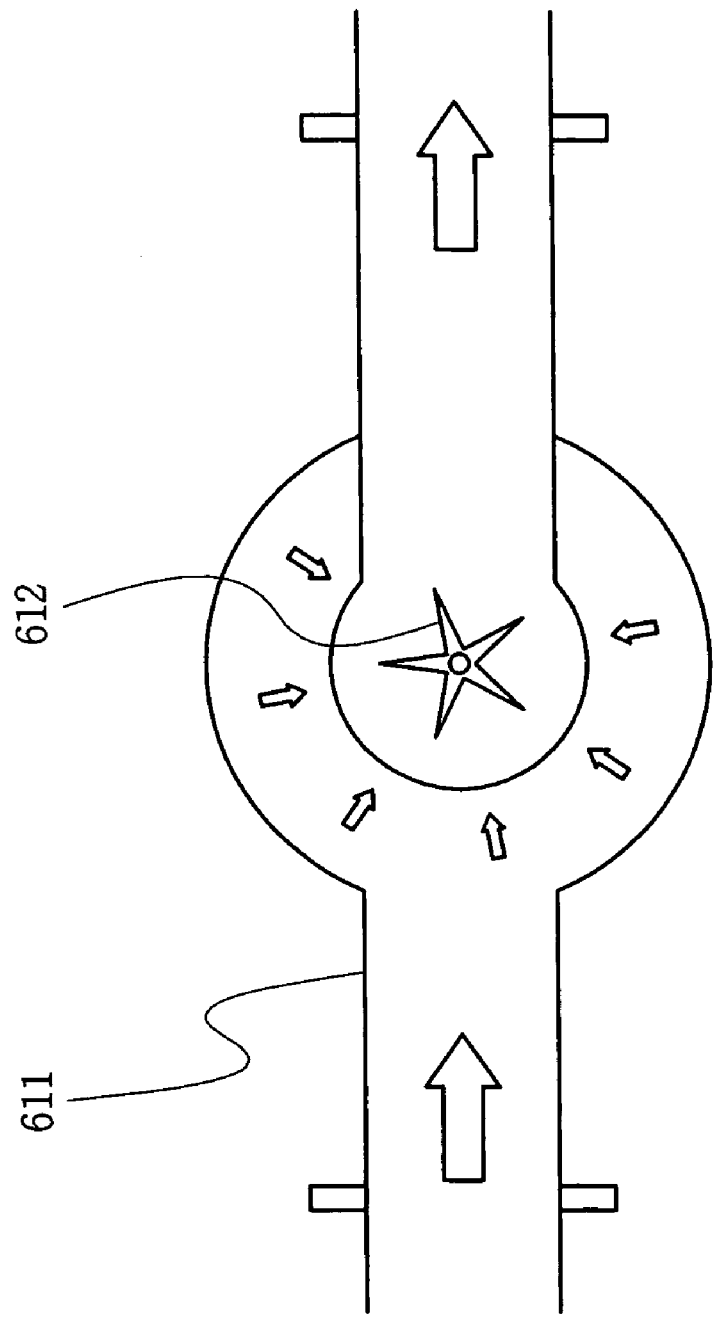
FIGS. 4 to 6 are respectively cross-sectional views illustrating the construction of a flow meter shown in FIG. 1 by sorts.
Figure 5A:
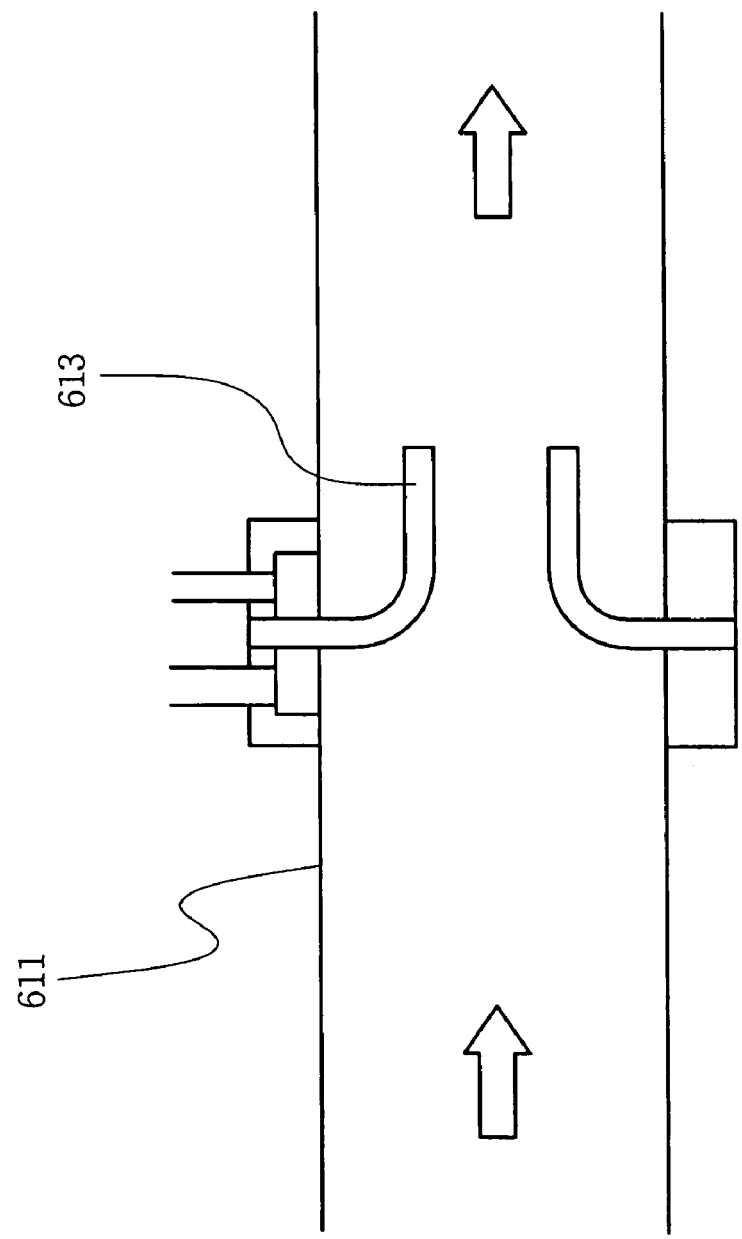
Figure 5B:
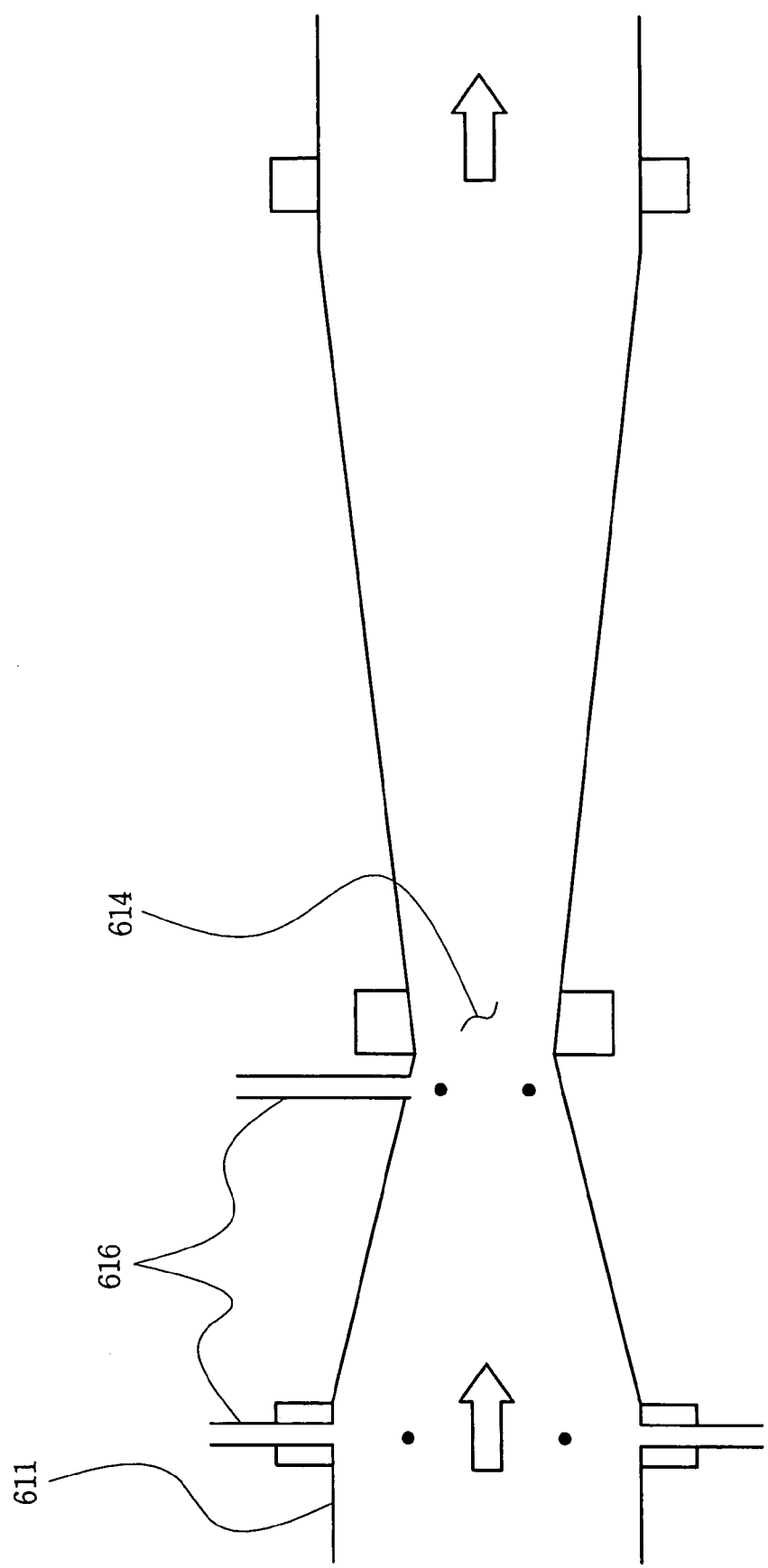
Figure 5C:
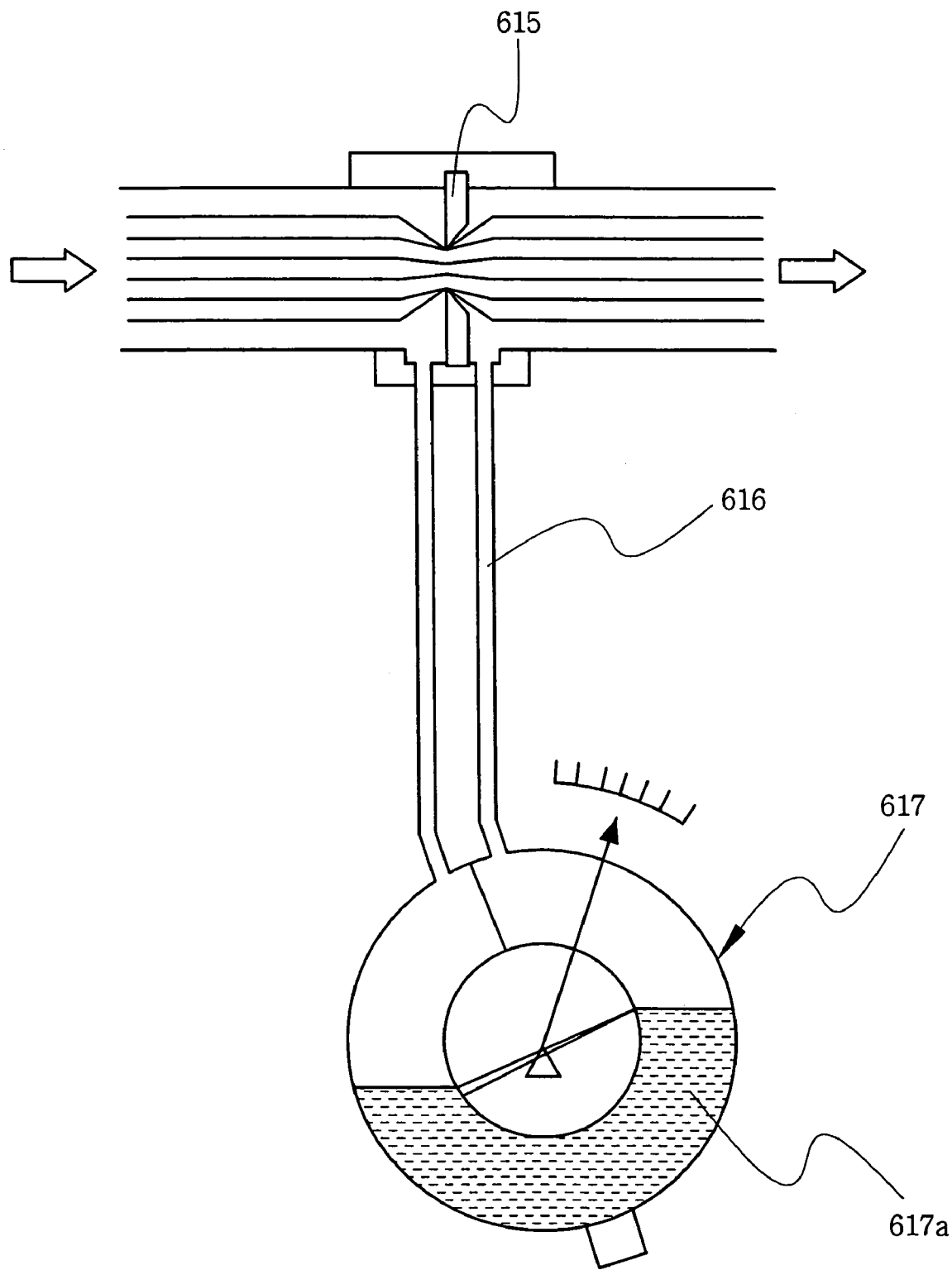
Figure 6:
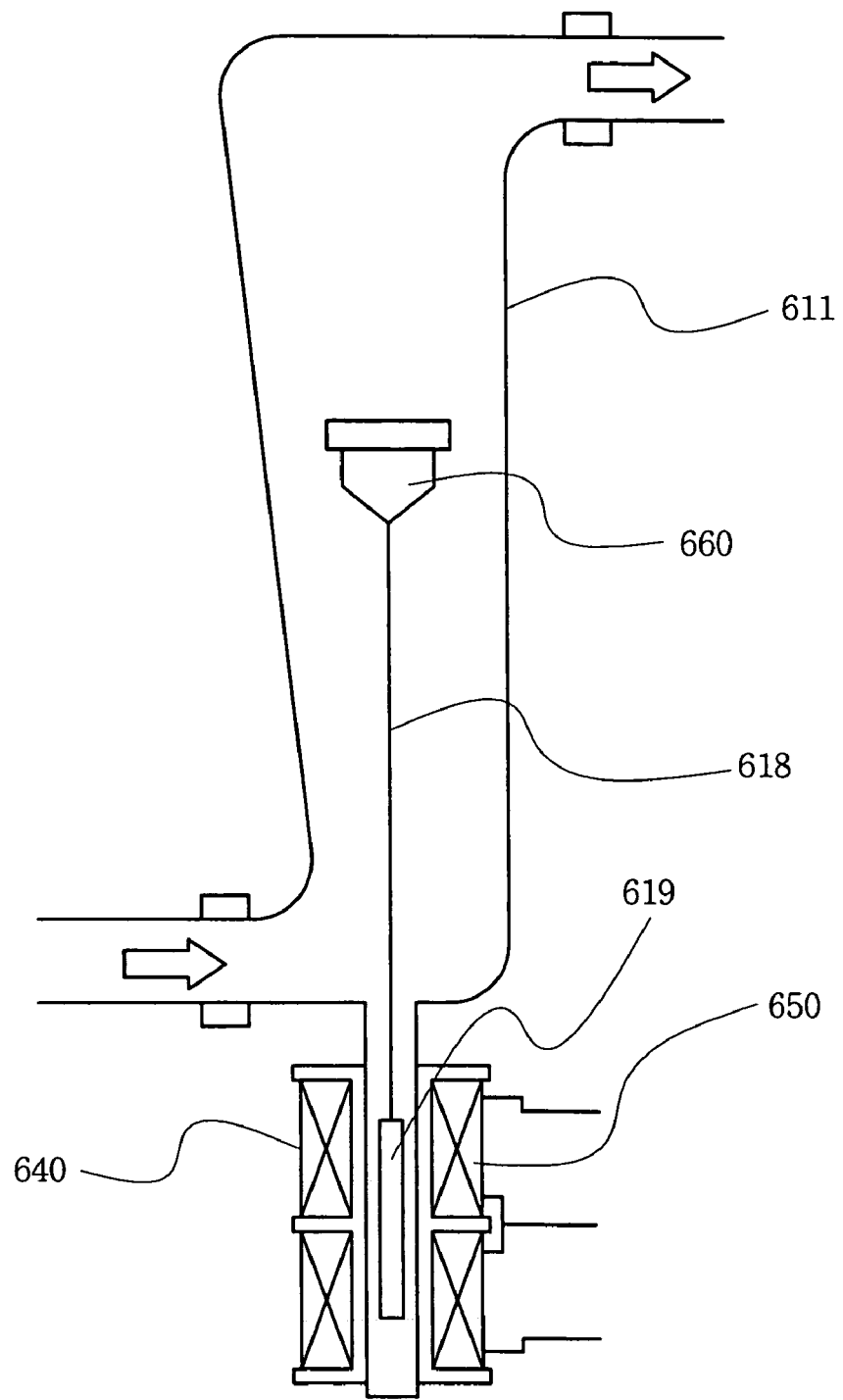

FIGS. 4 to 6 are cross-sectional views illustrating the construction of flow meter 610 shown in FIG. 1.

As shown in FIG. 4, an impeller type flow meter, which is conventionally known, may be used to implement flow meter 610. The impeller flow meter represents the flow of a flow material by enabling an impeller 612 to count the number of rotations while being rotated by the flow of material from pipe 611, such as the third supply line 450.

Further, as shown in 5A, 5B and 5C, a differential type pressure flow meter may be used to implement flow meter 610. As shown in FIGS. 5A and 5B, a Venturi tube 613 or a nozzle 614 may be fitted on pipe 611 in order to measure a pressure difference between the front and the rear of the respective apertures, and thereby measure the flow of material in relation to a reference. As shown in FIG. 5C, a differential pressure flow meter using the orifice 615 as the aperture may be formed so as to enable a plurality of capillary tubes 616 to be coupled to both ends of a ring-type of balance 617 which is filled with media 617a having a horizontal state, the capillary tubes being coupled to the front and rear of orifice 615. Accordingly, a pressure difference generated among a plurality of capillary tubes 616 is represented to the ring-type balance 617. Also, the speed of the material passing through orifice 615 and the flow due to the pressure difference may be displayed according to a set value.

Additionally, as shown in FIG. 6, a rotameter inserts a float 660 into pipe 611 extended while moving the flowing material toward the vertical direction relative to the ground, and measures buoyancy due to a pressure difference generated in the front and the rear of the float 660 which is pushed up by the flow of the flow material, and measures the flow of the flow material in a position of float 660 by balancing the weight of float 660. Further, the rotameter further includes a thread 618 configured to restrict float 660 vertically through a port formed on a bottom of pipe 611, an iron core 619 formed in an end of the thread 618 and moved to a vertical direction like the float 660, a plurality of coils 640, which are formed in one side of the iron core 619, for applying a predetermined power supply voltage, and a water meter 650, which is formed in the other side of the iron core 619 corresponding to a plurality of coils 640, for representing a voltage at which an electromagnetic field leaded from a plurality of coils 640 is varied according to the position of the iron core 619. In this case, the water meter 650 may represent the flow of the flow material which is flowed inside the pipe 611 due to the voltage.

Control valve 630 is opened/closed in response to a voltage signal or a gas pressure which is selectively outputted from a power supply terminal or a gas pressure supply terminal by a control signal of flow controller 620. For example, control valve 630 may include a solenoid valve which is operated by a voltage signal and a gas pressure valve which is operated by gas pressure. As illustrated above, when gas bubbles are removed from the photo-resist solution in housing 410, control valve 630 is closed so as to generate a predetermined vacuum voltage from housing 410, in case that second vacuum pump 580 of second gas discharge unit 550 is operated and control valve 565 is opened. Accordingly, when second vacuum pump 580 is operated, control valves 565 and 630 are exclusively opened/closed with each other. Then, when gas bubbles from the photo-resist in housing 410 are completely removed, the photo-resist is flowed through third supply line 450 while control valve 565 is closed and control valve 640 is opened. In this case, a supply pressure of the photo-resist which is flowed through third supply line 450 is determined by the pumping pressure of pump unit 300. Further, flow controller 620 determines the flow of the photo-resist through flow meter 610, and outputs a control signal capable of controlling operation of control valve 630 so as to discharge the preset flow of the photo-resist through dispensing nozzle 700. Accordingly, flow controller 620 may control the flow of the photo-resist which is controlled and supplied with the flow set by flow controller 620.

Further, dispensing nozzle 700 dispenses the photo-resist, which is controlled and supplied with the flow set by flow controller 620, on a central surface of the wafer W on a spin chuck 710 of a spin coater. In this case, because the fluidity of the photo-resist is varied by a temperature of the photo-resist dispensed on the wafer W varies, the temperature of the photo-resist becomes an important factor for determining a thickness of the photo-resist which is coated while spin chuck 710 of the spin coater is rotated. Accordingly, dispensing nozzle 700 includes a heating coil for heating the photo-resist with a predetermined temperature. Further, dispensing nozzle 700 is made of a metal material capable of covering the heating coil. Accordingly, the photo-resist dispensing apparatus may enable the photo-resist, in which the bubbles are removed from first and second gas discharge units 500 and 550, to be dispensed on the central surface of the wafer W through the dispensing nozzle 700, and to be coated at a uniform thickness on the surface of the wafer W rotated by the rotation of spin chuck 710 without generating a bad coating.

It will be apparent to one skilled in the art that as the number of housings 410 tanks 200, or filter units 400 may be increased or decreased. Similarly, the number of gas discharge units may be increased or decreased.

While the illustrated embodiments of the invention and their various advantages have been described in some detail, it should be understood that various changes, substitutions and alterations may be made herein without departing from the scope of the invention.

What is claimed is:

1. A photo-resist dispensing apparatus comprising:
   a tank adapted to hold a photo-resist solution;
   a pump unit adapted to pump the photo-resist solution from the tank;
   a filter unit adapted to receive the photo-resist solution from the pump unit; and a first gas discharge unit connected to the tank and adapted to remove gas bubbles from the photo-resist solution held in the tank, wherein the first gas discharge unit comprises;
    a first vacuum line coupled to an upper portion of the tank and adapted to discharge gas from the photo-resist solution in the tank,
    a first vacuum trap providing an airtight space adapted to regulate pumping pressure in the first vacuum line and collect the gas discharged from the first vacuum line,
    a second vacuum line connected between the first vacuum trap and a first vacuum pump, wherein the first vacuum pump is adapted to pump gas from the first vacuum trap, and
    a control valve associated with the first vacuum line and adapted to prevent external gas from back flowing into the tank through the first vacuum pump; and
a second gas discharge unit connected to the filter unit and adapted to remove gas bubbles from the photo-resist solution in the filter unit, wherein the second gas discharge unit comprises;
    a third vacuum line coupled to an upper portion of the filter unit and adapted to discharge gas from the photo-resist solution in the filter unit,
    a second vacuum trap providing an airtight space adapted to regulate pumping pressure in the third vacuum line and collect the gas discharged from the filter unit,
    a fourth vacuum line connected between the second vacuum trap and a second vacuum pump, wherein the second vacuum pump is adapted to pump gas from the second vacuum trap, and
    a control valve associated with the third vacuum line and adapted to prevent external gas from back flowing into the filter unit through the second vacuum pump.

2. The photo-resist dispensing apparatus of claim 1, further comprising:
a first level sensor adapted to sense a level of photo-resist solution in the tank.

3. The photo-resist dispensing apparatus of claim 1, further comprising:
a first supply line connected to an upper portion of the tank and adapted to supply the photo-resist solution to the tank; and,
a second supply line connected to a lower portion of the tank and adapted to discharge the photo-resist solution to the pump unit.

4. The photo-resist dispensing apparatus of claim 3, further comprising: a valve adapted to control a flow of the photo-resist solution through the first supply line.

5. The photo-resist dispensing apparatus of claim 1, wherein an outlet of the first vacuum line extends to a position proximate a bottom portion of the vacuum trap, and an inlet of the second vacuum line is coupled to an upper portion of the vacuum trap.

6. The photo-resist dispensing apparatus of claim 1, wherein the first vacuum pump comprises a rotary pump or a dry pump.

7. The photo-resist dispensing apparatus of claim 1, wherein the tank comprises an agitator configured to stir the photo-resist solution.

8. The photo-resist dispensing apparatus of claim 7, wherein the agitator comprises:
an axially disposed stirring rod normally submerged in the photo-resist solution.

9. The photo-resist dispensing apparatus of claim 1, wherein the filter unit comprises a level sensor adapted to sense a level of photo-resist solution in the filter unit.

10. The photo-resist dispensing apparatus of claim 1, wherein the tank comprises a vacuum pressure sensor adapted to measure vacuum pumping pressure provided by the first vacuum pump.

11. The photo-resist dispensing apparatus of claim 10, wherein the vacuum pressure sensor includes a Pirani gauge or a Baratron sensor.

12. The photo-resist dispensing apparatus of claim 1, wherein the pump unit comprises a gear pump.

13. The photo-resist dispensing apparatus of claim 1, wherein the filter unit comprises:
a housing adapted to receive the photo-resist solution supplied from the pump unit;
a level sensor adapted to sense a level of the photo-resist solution inside the housing; and
a filter adapted to filter the photo-resist solution to remove contaminants.

14. The photo-resist dispensing apparatus of claim 13, wherein the filter is formed from a plurality of thin porous plates through which the photo-resist may pass.

15. The photo-resist dispensing apparatus of claim 14, wherein the filter unit further comprises at least one supporter configured to support the filter within the housing.

16. The photo-resist dispensing apparatus of claim 1, further comprising:
a discharge control unit adapted to control a discharge volume for the photo-resist solution; and
a dispensing nozzle adapted to dispense the photo-resist solution under the control of the discharge control unit.

17. The photo-resist dispensing apparatus of claim 16, wherein the discharge control unit comprises:
a flow meter adapted to sense flow of the photo-resist solution from the filter unit;
a flow controller recognizing the flow of the photo-resist solution through the flow meter and outputting a control signal to control a uniform flow of photo-resist solution from the filter unit; and
a valve adapted to control the flow of photo-resist solution through the dispensing nozzle.

18. The photo-resist dispensing apparatus of claim 17, wherein the flow meter comprises an impeller flow meter, a differential pressure flow meter, or rotameter.

* * * * *